(12) United States Patent
Nakashima et al.

(10) Patent No.: US 8,597,867 B2
(45) Date of Patent: Dec. 3, 2013

(54) LACTONE COPOLYMER AND RADIATION-SENSITIVE RESIN COMPOSITION

(75) Inventors: Hiromitsu Nakashima, Tokyo (JP); Tomohiro Utaka, Tokyo (JP); Takashi Chiba, Tokyo (JP); Eiji Yoneda, Tokyo (JP); Atsushi Nakamura, Tokyo (JP)

(73) Assignee: JSR Corporation, Tokyo (JP)

( * ) Notice: Subject to any disclaimer, the term of this patent is extended or adjusted under 35 U.S.C. 154(b) by 1204 days.

(21) Appl. No.: 11/579,646

(22) PCT Filed: May 2, 2005

(86) PCT No.: PCT/JP2005/008288
§ 371 (c)(1),
(2), (4) Date: Oct. 6, 2008

(87) PCT Pub. No.: WO2005/108444
PCT Pub. Date: Nov. 17, 2005

(65) Prior Publication Data
US 2009/0053649 A1 Feb. 26, 2009

(30) Foreign Application Priority Data
May 6, 2004 (JP) .................................. 2004-137707

(51) Int. Cl.
*G03F 7/00* (2006.01)
*G03F 7/004* (2006.01)
*G03F 7/028* (2006.01)

(52) U.S. Cl.
USPC ........................ 430/270.1; 430/905; 430/913

(58) Field of Classification Search
USPC ..................................... 430/270.1, 905, 913
See application file for complete search history.

(56) References Cited

U.S. PATENT DOCUMENTS

| | | | |
|---|---|---|---|
| 6,927,009 B2 * | 8/2005 | Kodama et al. | 430/270.1 |
| 7,125,643 B2 * | 10/2006 | Harada et al. | 430/270.1 |
| 7,205,090 B2 * | 4/2007 | Takemoto et al. | 430/270.1 |
| 7,217,496 B2 * | 5/2007 | Khojasteh et al. | 430/270.1 |
| 7,232,642 B2 * | 6/2007 | Takemoto et al. | 430/270.1 |
| 2003/0077540 A1 | 4/2003 | Kodama et al. | |
| 2003/0078352 A1 * | 4/2003 | Miyazawa et al. | 526/245 |
| 2003/0203309 A1 | 10/2003 | Nishimura et al. | |
| 2004/0214102 A1 * | 10/2004 | DiPietro et al. | 430/270.1 |

FOREIGN PATENT DOCUMENTS

| | | |
|---|---|---|
| EP | 0 159 428 | 4/1984 |
| EP | 1179750 A1 * | 2/2002 |
| EP | 1500977 A1 * | 1/2005 |
| EP | 1616854 A1 * | 1/2006 |
| JP | 59093448 | 5/1984 |
| JP | 5-188598 | 7/1993 |
| JP | 6-12452 | 2/1994 |
| JP | 2003/005375 | 1/2003 |
| JP | 2003-252933 | 9/2003 |
| JP | 2003/252933 | 9/2003 |
| JP | 2004-118136 | 4/2004 |

OTHER PUBLICATIONS

Taiwan Office Action for corresponding TW Application No. 094114394, Oct. 14, 2011.

* cited by examiner

*Primary Examiner* — Amanda C. Walke
(74) *Attorney, Agent, or Firm* — Ditthavong Mori & Steiner, P.C.

(57) ABSTRACT

A radiation-sensitive resin composition excelling in basic properties as a resist such as sensitivity, resolution, and the like, having a wide depth of focus (DOF) to both a line-and-space pattern and an isolated space pattern, and exhibiting a minimal line width change due to fluctuation of a bake temperature, and having a small line width limit in which the line pattern destroying phenomenon does not occur, and a lactone-containing copolymer useful as a resin component of the composition are provided.

The lactone-containing copolymer is represented by a copolymer of the following compounds (1-1), (2-1), and (3-1).

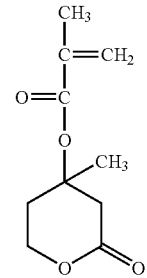

(1-1)

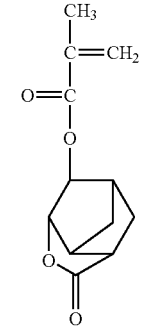

(2-1)

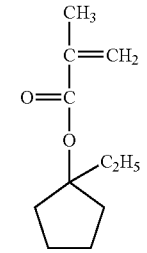

(3-1)

The radiation-sensitive resin composition comprises (a) the lactone-containing copolymer and (b) a photoacid generator.

19 Claims, No Drawings

LACTONE COPOLYMER AND RADIATION-SENSITIVE RESIN COMPOSITION

TECHNICAL FIELD

The present invention relates to a lactone-containing copolymer and a radiation-sensitive resin composition and, particularly, to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams, as well as to a lactone-containing copolymer utilized in the resin component of the composition.

BACKGROUND ART

In the field of microfabrication represented by the manufacture of integrated circuit devices, lithographic technology enabling microfabrication with a line width of about 200 nm or less using short wavelength radiations such as an ArF excimer laser (wavelength: 193 nm), $F_2$ excimer laser (wavelength: 157 nm), and the like has been demanded in order to increase the degree of integration in recent years.

As a resist material applicable to such short wavelength radiations, a number of chemical amplification-type radiation-sensitive resin compositions utilizing a chemical amplification effect between a resin component having an acid-dissociable functional group and a photoacid generator which generates an acid upon irradiation with radiations has been proposed. In recent years, radiation-sensitive resin compositions using a copolymer having two or more types of (meth)acrylic recurring units with different lactone structures as a resin component have been proposed (for example, refer to Patent Documents 1 and 2).

Patent Document 1 JP-A-2003-5375
Patent Document 2 JP-A-2003-252933

However, when a still higher degree of integrity is demanded in the field of an integrated circuit element, radiation-sensitive resin compositions are severely required to exhibit various properties, not to mention of basic properties as a resist such as sensitivity and resolution. In particular, strong demands in recent years include a wide common depth of focus (common DOF) to a line-and-space pattern, an isolated line pattern, and/or an isolated space pattern, a minimal line width change due to fluctuation of the bake temperature, and the like.

However, these performances are intricately related to a radiation-sensitive resin composition as well as to a photoacid generator component, additives, and the like. Furthermore, the relation between a chemical structure and characteristics as a resist of the resin component is complicated. Even if a specific resin component is selected, it is extremely difficult to anticipate properties as a resist or to develop a resist that can satisfy the required performance.

DISCLOSURE OF THE INVENTION

An object of the present invention is to provide a radiation-sensitive resin composition suitable as a chemically-amplified resist having high transparency to radiation, excelling in basic properties as a resist such as sensitivity, resolution, and the like, having a wide depth of focus (common DOF) to both a line-and-space pattern and an isolated space pattern, exhibiting a minimal line width change due to fluctuation of a bake temperature, having a small line width limit in which the line pattern destroying phenomenon does not occur, and being capable of stably forming high precision resist patterns, and a lactone-containing copolymer, which is a three component (meth)acrylic copolymer having a specific non-bridged lactone structure and a specific bridged lactone structure, useful as a resin component in the radiation-sensitive resin composition.

Specifically, the present invention provides a lactone-containing copolymer [I] (hereinafter referred to as "copolymer [I]") which is insoluble or scarcely soluble in alkali, but becomes alkali-soluble by the action of an acid, has a recurring unit shown by the following formula (1), a recurring unit shown by the following formula (2), and a recurring unit shown by the following formula (3), and has a polystyrene-reduced weight average molecular weight determined by gel permeation chromatography (GPC) of 1,000 to 100,000,

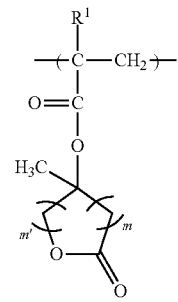

(1)

wherein $R^1$ represents a hydrogen atom, methyl group, trifluoromethyl group, or hydroxymethyl group and m and m' are independently an integer of 1 to 3,

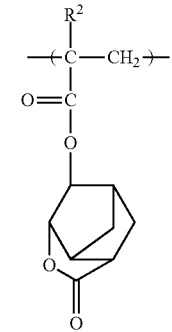

(2)

wherein $R^2$ represents a hydrogen atom, methyl group, trifluoromethyl group, or hydroxymethyl group, and

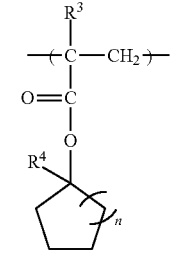

(3)

wherein $R^3$ represents a hydrogen atom, methyl group, trifluoromethyl group, or hydroxymethyl group, and $R^4$ indicates a linear or branched alkyl group having 1 to 4 carbon atoms, and n is 1 or 2.

In the present invention, the term "insoluble or scarcely soluble in alkali" refers to properties in which the initial thickness of a film formed only using the copolymer [I] remains in an amount of 50% or more after development under alkaline conditions employed when forming a resist pattern using a resist film formed from a radiation-sensitive resin composition containing the copolymer [I].

Secondly, the present invention provides a radiation-sensitive resin composition comprising (a) the copolymer [I] and (b) a photoacid generator.

The present invention is described below in detail.

Copolymer [I]

The copolymer [I] is a copolymer having a recurring unit shown by the following formula (1) (hereinafter referred to as "recurring unit (1)"), a recurring unit shown by the following formula (2) (hereinafter referred to as "recurring unit (2)"), a recurring unit shown by the following formula (3) (hereinafter referred to as "recurring unit (3)").

In the formula (1), a methyl group is particularly preferable as $R^1$, 1 is particularly preferable as m, and 2 is particularly preferable as m'.

Either one type of recurring unit (1) may be present in the copolymer [I] or two or more different types of recurring units (1) may be present in the copolymer [I].

In the formula (2), a particularly preferable $R^2$ is a methyl group.

Either one type of recurring unit (2) may be present in the copolymer [I] or two or more different types of recurring units (2) may be present in the copolymer [I].

In the formula (3), a particularly preferable $R^3$ is a methyl group and particularly preferable n is 1.

As examples of the linear or branched alkyl group having 1 to 4 carbon atoms represented by $R^4$ in the formula (3), a methyl group, ethyl group, n-propyl group, i-propyl group, n-butyl group, 2-methylpropyl group, 1-methylpropyl group, and t-butyl group can be given.

Of these, an ethyl group, n-propyl group, i-propyl group, and the like are preferable.

Either one type of recurring unit (3) may be present in the copolymer [I] or two or more different types of recurring units (3) may be present in the copolymer [I].

The copolymer [I] can further comprise recurring units (hereinafter referred to as "other recurring units") other than the recurring units (1), (2), and (3).

As preferable examples of the other recurring units in the present invention, at least one of the groups selected from a recurring unit shown by the following formula (4) (hereinafter referred to as "recurring unit (4)"), a recurring unit shown by the following formula (5) (hereinafter referred to as "recurring unit (5)"), a recurring unit shown by the following formula (6) (hereinafter referred to as "recurring unit (6)"), a recurring unit shown by the following formula (7) (hereinafter referred to as "recurring unit (7)"), and a recurring unit shown by the following formula (8) (hereinafter referred to as "recurring unit (8)") can be given.

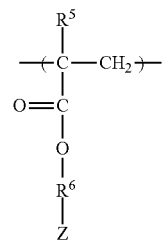

wherein $R^5$ represents a hydrogen atom, a methyl group, a trifluoromethyl group, or a hydroxymethyl group, $R^6$ represents a linear or branched alkylene group having 1 to 4 carbon atoms in the main chain or a divalent alicyclic hydrocarbon group having 3 to 20 carbon atoms, and Z represents a hydrogen atom, a hydroxyl group, a cyano group, or a linear, branched, or cyclic hydroxyalkyl group having 1 to 10 carbon atoms,

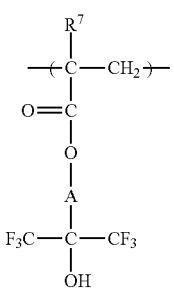

wherein $R^7$ represents a hydrogen atom, a methyl group, a trifluoromethyl group, or a hydroxymethyl group and A represents a single bond, a linear or branched alkylene group having 1 to 6 carbon atoms in the main chain, a divalent alicyclic hydrocarbon group having 4 to 20 carbon atoms, a group -A'-O— (wherein A' represents a linear or branched alkylene group having 1 to 6 carbon atoms in the main chain and bonds to the ester oxygen atom in the formula (5)), or a group -A"-COO— (wherein A" represents a linear or branched alkylene group having 1 to 6 carbon atoms in the main chain and bonds to the ester oxygen atom in the formula (5)),

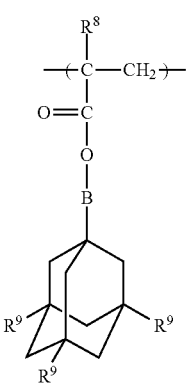

wherein $R^8$ represents a hydrogen atom, a methyl group, a trifluoromethyl group, or a hydroxymethyl group, B represents a single bond, a linear or branched alkylene group having 1 to 4 carbon atoms in the main chain, and $R^9$ individually represents a hydrogen atom, a hydroxyl group, a cyano group, a carboxyl group, a group —COOR$^{10}$ (wherein $R^{10}$ represents a linear or branched alkyl group having 1 to 4 carbon atoms or a monovalent alicyclic hydrocarbon group having 3 to 20 carbon atoms), or a group -M-R$^{11}$ (wherein M represents a linear or branched alkylene group having 1 to 3 carbon atoms in the main chain and R$^{11}$ represents a hydrogen atom, a hydroxyl group, a cyano group, or a group —COOR$^{12}$ (wherein R$^{12}$ represents a hydrogen atom, a linear or branched alkyl group having 1 to 4 carbon atoms, or a monovalent alicyclic hydrocarbon group having 3 to 20 carbon atoms)), provided that one or more R$^9$s are groups other than a hydrogen atom, (7)

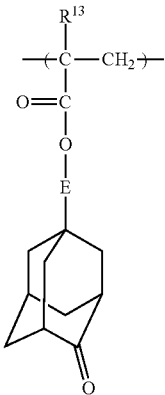

wherein R$^{13}$ represents a hydrogen atom, a methyl group, a trifluoromethyl group, or a hydroxymethyl group and E represents a single bond, a substituted or unsubstituted, linear or branched alkylene group having 1 to 6 carbon atoms in the main chain, a substituted or unsubstituted divalent alicyclic hydrocarbon group having 4 to 20 carbon atoms, a group -E'-O— (wherein E' represents a linear or branched alkylene group having 1 to 6 carbon atoms in the main chain and bonds to the ester oxygen atom in the formula (7)), or a group -E"-COO— (wherein E" represents a linear or branched alkylene group having 1 to 6 carbon atoms in the main chain and bonds to the ester oxygen atom in the formula (7)), and (8)

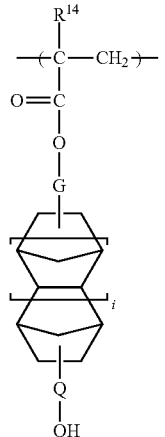

wherein R$^{14}$ represents a hydrogen atom, a methyl group, a trifluoromethyl group, or a hydroxymethyl group, G represents a single bond, a substituted or unsubstituted, linear or branched alkylene group having 1 to 6 carbon atoms in the main chain, a substituted or unsubstituted divalent alicyclic hydrocarbon group having 4 to 20 carbon atoms, a group -G'-O— (wherein G' represents a linear or branched alkylene group having 1 to 6 carbon atoms in the main chain and bonds to the ester oxygen atom in the formula (8)), or a group -G"-COO— (wherein G" represents a linear or branched alkylene group having 1 to 6 carbon atoms in the main chain and bonds to the ester oxygen atom in the formula (8)), Q represents a single bond, a substituted or unsubstituted, linear or branched alkylene group having 1 to 6 carbon atoms in the main chain, a substituted or unsubstituted divalent alicyclic hydrocarbon group having 4 to 20 carbon atoms, a group -Q'-O— (wherein Q' represents a linear or branched alkylene group having 1 to 6 carbon atoms in the main chain and bonds to the ester oxygen atom in the formula (8)), or a group -Q"-COO— (wherein Q" represents a linear or branched alkylene group having 1 to 6 carbon atoms in the main chain and bonds to the ester oxygen atom in the formula (8)), and i is 0 or 1.

The recurring units (4) to (8) will now be discussed.

Preferable groups for $R^5$ in the formula (4) are a hydrogen atom and a methyl group.

As examples of the linear or branched alkylene group having 1 to 4 carbon atoms in the main chain represented by $R^6$ in the formula (4), a methylene group, 1,2-ethylene group, 1,2-propylene group, 1,3-propylene group, 1,2-tetramethylene group, 1,3-tetramethylene group, 2-methyl-1,3-propylene group, and the like can be given.

As examples of the divalent alicyclic hydrocarbon group having 3 to 20 carbon atoms represented by $R^6$, groups derived from a cycloalkane such as cyclopropane, cyclobutane, cyclopentane, cyclohexane, cycloheptane, or cyclooctane, groups derived from a bridged hydrocarbon group such as bicyclo[2.2.1]heptane, tricyclo[5.2.1.0$^{2,6}$]decane, tricyclo [6.2.1$^{3,6}$.0$^{2,7}$]dodecane, or adamantane, alkyl-substituted derivatives of these groups, and the like can be given.

As $R^6$ in the formula (4), groups derived from cyclopentane, cyclohexane, bicyclo[2.2.1]heptane, tricyclo[5.2.1.0$^{2,6}$] decane, or adamantane, alkyl-substituted derivatives of these groups, and the like are preferable.

As examples of the linear, branched, or cyclic hydroxyalkyl group having 1 to 10 carbon atoms represented by Z in the formula (4), hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, 4-hydroxy-n-butyl group, 5-hydroxy-n-pentyl group, 6-hydroxy-n-hexyl group, 3-hydroxycyclopentyl group, 4-hydroxycyclohexyl group, and the like can be given.

As specific preferable groups represented by —R$^6$—Z in the formula (4), a hydroxymethyl group, 2-hydroxyethyl group, 2-hydroxy-n-propyl group, 3-hydroxy-n-propyl group, cyanomethyl group, 1-cyanoethyl group, 2-cyanoethyl group, 2-cyano-n-propyl group, 3-cyano-n-propyl group, 3-hydroxycyclopentyl group, 3-cyanocyclopentyl group, 3-hydroxymethylcyclopentyl group, 4-hydroxycyclohexyl group, 4-cyanocyclohexyl group, 4-hydroxymethylcyclohexyl group, 8-hydroxy-3-tricyclo[5.2.1.0$^{2,6}$.]decanyl group, 8-cyano-3-tricyclo[5.2.1.0$^{2,6}$]decanyl group, 8-hydroxymethyl-3-tricyclo[5.2.1.0$^{2,6}$]decanyl group, 3-hydroxy-1-adamantyl group, 3-cyano-1-adamantyl group, 3-hydroxymethyl-1-adamantyl group, and the like can be given.

Either one type of recurring unit (4) may be present in the copolymer [I] or two or more different types of recurring units (4) may be present in the copolymer [I].

Preferable groups for $R^7$ in the formula (5) are a hydrogen atom and a methyl group.

As examples of the linear or branched alkylene group having 1 to 6 carbon atoms in the main chain represented by A in the formula (5), a methylene group, 1,2-ethylene group, 1,2-propylene group, 1,3-propylene group, 1,2-tetramethylene group, 1,3-tetramethylene group, 2-methyl-1,3-propylene group, hexamethylene group, and the like can be given.

As examples of the divalent alicyclic hydrocarbon group having 4 to 20 carbon atoms represented by A, groups derived from a cycloalkane such as cyclobutane, cyclopentane, cyclohexane, cycloheptane, or cyclooctane, groups derived from a bridged hydrocarbon group such as bicyclo[2.2.1]heptane, tricyclo[5.2.1.0$^{2,6}$]decane, tricyclo[6.2.1$^{3,6}$.0$^{2,7}$]dodecane, or adamantane, and the like can be given.

As examples of the -A'-O— group representing A, —CH$_2$—O—, —(CH$_2$)$_2$—O—, —(CH$_2$)$_3$—O—, —(CH$_2$)$_4$—O—, —(CH$_2$)$_6$—O—, and the like can be given.

As examples of the -A"-COO— group representing A, —CH$_2$—COO—, —(CH$_2$)$_2$—OO—, —(CH$_2$)$_3$—COO—, —(CH$_2$)$_4$—COO—, —(CH$_2$)$_6$—COO—, and the like can be given.

As examples of A in the formula (5), a methylene group, 1,2-ethylene group, 1,2-propylene group, 1,3-propylene group, 1,2-tetramethylene group, 1,3-tetramethylene group, 2-methyl-1,3-propylene group, hexamethylene group, groups derived from cyclopentane, cyclohexane, bicyclo[2.2.1]heptane, tricyclo[5.2.1.0$^{2,6}$]decane, or adamantane, and the like can be given.

Either one type of recurring unit (5) may be present in the copolymer [I] or two or more different types of recurring units (5) may be present in the copolymer [I].

Preferable groups for $R^8$ in the formula (6) are a hydrogen atom and a methyl group.

As examples of the linear or branched alkylene group having 1 to 4 carbon atoms in the main chain represented by B in the formula (6), a methylene group, 1,2-ethylene group, 1,2-propylene group, 1,3-propylene group, 1,2-tetramethylene group, 1,3-tetramethylene group, 2-methyl-1,3-propylene group, and the like can be given.

Preferable groups for B in the formula (6) are a single bond, a methylene group, 1,2-ethylene group, and the like.

As examples of the —COOR$^{10}$ representing $R^9$ in the formula (6), a methoxycarbonyl group, ethoxycarbonyl group, cyclopentyloxycarbonyl group, cyclohexyloxycarbonyl group, 1-methylcyclopentyloxycarbonyl group, 1-ethylcyclopentyloxycarbonyl group, 1-methylcyclohexyloxycarbonyl group, 1-ethylcyclohexyloxycarbonyl group, bicyclo[2.2.1]heptyloxycarbonyl group, tricyclo[5.2.1.0$^{2,6}$]decanyloxycarbonyl group, adamantyloxycarbonyl group, and the like can be given.

As examples of the group -M-R$^{11}$ representing $R^9$, a methyl group, ethyl group, n-propyl group, i-propyl group, hydroxymethyl group, 2-hydroxyethyl group, cyanomethyl group, 2-cyanoethyl group, methoxycarbonylmethyl group, ethoxycarbonylmethyl group, 2-methoxycarbonylethyl group, 2-ethoxycarbonylethyl group, cyclopentyloxycarbonylmethyl group, cyclohexyloxycarbonylmethyl group, 1-methylcyclopentyloxycarbonyl group, 1-ethylcyclopentyloxycarbonyl group, 1-methylcyclohexyloxycarbonyl group, 1-ethylcyclohexyloxycarbonyl group, bicyclo[2.2.1]heptyloxycarbonylmethyl group, tricyclo[5.2.1.0$^{2,6}$]decanyloxycarbonylmethyl group, adamantyloxycarbonylmethyl group, and the like can be given.

As examples of $R^9$ in the formula (6), a methyl group, ethyl group, n-propyl group, i-propyl group, hydroxymethyl group, 2-hydroxyethyl group, cyanomethyl group, 2-cyanoethyl group, methoxycarbonyl group, methoxycarbonylmethyl group, ethoxycarbonyl group, ethoxycarbonylmethyl group, 2-methoxycarbonylethyl group, 2-ethoxycarbonylethyl group, cyclopentyloxycarbonyl group, cyclohexyloxycarbonyl group, 1-methylcyclopentyloxycarbonyl group, 1-ethylcyclopentyloxycarbonyl group, 1-methylcyclohexyloxycarbonyl group, 1-ethylcyclohexyloxycarbonyl group, and the like are preferable.

Either one type of recurring unit (6) may be present in the copolymer [I] or two or more different types of recurring units (6) may be present in the copolymer [I].

Preferable groups for $R^{13}$ in the formula (7) are a hydrogen atom and a methyl group.

As examples of the substituted or unsubstituted, linear or branched alkylene group having 1 to 6 carbon atoms in the main chain represented by E in the formula (7), a methylene group, 1,2-ethylene group, 1,2-propylene group, 1,3-propylene group, 1,2-tetramethylene group, 1,3-tetramethylene group, 2-methyl-1,3-propylene group, and hexamethylene group, and groups obtainable by substituting these groups with at least one group selected from a hydroxyl group, a cyano group, a carboxyl group, a group —COOR$^{15}$ (wherein $R^{15}$ represents a linear or branched alkyl group having 1 to 4 carbon atoms or a monovalent alicyclic hydrocarbon group having 3 to 20 carbon atoms, hereinafter the same), and a group -M'-R$^{16}$ [wherein M' represents a linear or branched alkylene group having 1 to 4 carbon atoms in the main chain and R$^{16}$ represents a hydroxyl group, a cyano group, or a group —COOR$^{17}$ (wherein R$^{17}$ represents a hydrogen atom, a linear or branched alkyl group having 1 to 4 carbon atoms, or a monovalent alicyclic hydrocarbon group having 3 to 20 carbon atoms), hereinafter the same] can be given.

As examples of the substituted or unsubstituted divalent alicyclic hydrocarbon group having 4 to 20 carbon atoms represented by E, groups derived from a cycloalkane such as cyclobutane, cyclopentane, cyclohexane, cycloheptane, or cyclooctane and groups derived from a bridged hydrocarbon such as bicyclo[2.2.1]heptane, tricyclo[5.2.1.0$^{2,6}$]decane, tricyclo[6.2.1$^{3,6}$.0$^{2,7}$]dodecane, or adamantane, and groups obtainable by substituting these groups with one or more groups selected from a hydroxyl group, a cyano group, a carboxyl group, a group —COOR$^{15}$, and a group -M'-R$^{16}$ can be given.

As examples of the -E'-O— group representing E, —CH$_2$—O—, —(CH$_2$)$_2$—O—, —(CH$_2$)$_3$—O—, —(CH$_2$)$_4$—O—, —(CH$_2$)$_6$—O—, and the like can be given.

As examples of the -E"-COO— group representing E, —CH$_2$—COO—, —(CH$_2$)$_2$—COO—, —(CH$_2$)$_3$—COO—, —(CH$_2$)$_4$—COO—, —(CH$_2$)$_6$—COO—, and the like can be given.

Preferable groups for E in the formula (7) are a single bond, a methylene group, 1,2-ethylene group, and the like.

Either one type of recurring unit (7) may be present in the copolymer [I] or two or more different types of recurring units (7) may be present in the copolymer [I].

Preferable groups for $R^{14}$ in the formula (8) are a hydrogen atom and a methyl group.

As examples of the substituted or unsubstituted, linear or branched alkylene group having 1 to 6 carbon atoms in the main chain represented by G and Q in the formula (8), a methylene group, 1,2-ethylene group, 1,2-propylene group, 1,3-propylene group, 1,2-tetramethylene group, 1,3-tetramethylene group, 2-methyl-1,3-propylene group, and hexamethylene group, and groups obtainable by substituting these groups with at least one group selected from a hydroxyl group, a cyano group, a carboxyl group, a group —COOR$^{18}$ (wherein R$^{18}$ represents a linear or branched alkyl group having 1 to 4 carbon atoms or a monovalent alicyclic hydrocarbon group having 3 to 20 carbon atoms, hereinafter the same), and a group -M"-$R^{19}$ [wherein M" represents a linear or branched alkylene group having 1 to 4 carbon atoms in the main chain and $R^{19}$ represents a hydroxyl group, a cyano group, or a group —COO$R^{20}$ (wherein $R^{20}$ represents a hydrogen atom, a linear or branched alkyl group having 1 to 4 carbon atoms, or a monovalent alicyclic hydrocarbon group having 3 to 20 carbon atoms), hereinafter the same] can be given.

As examples of the substituted or unsubstituted divalent alicyclic hydrocarbon group having 4 to 20 carbon atoms represented by G and Q, groups derived from a cycloalkane such as cyclobutane, cyclopentane, cyclohexane, cycloheptane, or cyclooctane and groups derived from a bridged hydrocarbon such as bicyclo[2.2.1]heptane, tricyclo[5.2.1.0$^{2,6}$]decane, tricyclo[6.2.1$^{3,6}$.0$^{2,7}$]dodecane, or adamantane, and groups obtainable by substituting these groups with one or more groups selected from a hydroxyl group, a cyano group, a carboxyl group, a group —COO$R^{18}$, and a group -M"-$R^{19}$ can be given.

As examples of the -G'-O— group representing G and -Q'-O— group representing Q, —CH$_2$—O—, —(CH$_2$)$_2$—O—, —(CH$_2$)$_3$—O—, —(CH$_2$)$_4$—O—, —(CH$_2$)$_6$—O—, and the like can be given.

As examples of the -G"-COO— group representing G and -Q"-COO— group representing Q, —CH$_2$—COO—, —(CH$_2$)$_2$—COO—, —(CH$_2$)$_3$—COO—, —(CH$_2$)$_4$—COO—, —(CH$_2$)$_6$—COO—, and the like can be given.

Preferable groups for G and Q in the formula (8) are a single bond, a methylene group, 1,2-ethylene group, groups derived from a cycloalkane such as cyclopentane or cyclohexane, and the like.

G and Q in the formula (8) may be either identical or different.

i in the formula (8) is preferably either 0 or 1.

Either one type of recurring unit (8) may be present in the copolymer [I] or two or more different types of recurring units (8) may be present in the copolymer [I].

Examples of recurring units other than the recurring units (4) to (8) include recurring units obtainable by cleavage of a polymerizable unsaturated bond of mono-functional monomers such as carboxyl group-containing (meth)acrylic acid esters such as 2-carboxyethyl (meth)acrylate, 2-carboxy-n-propyl (meth)acrylate, 3-carboxy-n-propyl (meth)acrylate, 4-carboxy-n-butyl (meth)acrylate, and 4-carboxycyclohexyl (meth)acrylate; unsaturated nitrile compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; and unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; recurring units obtainable by cleavage of a polymerizable unsaturated bond of poly-functional monomers such as polyfunctional (meth)acrylic acid esters having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; (meth)acrylic acid esters having no bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

Either one type of recurring units other than recurring units (4) to (8) may be present in the copolymer [I] or two or more different types of recurring units other than recurring units (4) to (8) may be present in the copolymer [I].

The content of each recurring unit in the copolymer [I] is appropriately adjusted according to the use and the like of the copolymer [I]. Such a content in the case of the radiation-sensitive resin composition hereinafter described is as follows. The content of the recurring unit (1) is usually 5 to 50 mol %, preferably 5 to 40 mol %, and still more preferably 5 to 25 mol % of the total amount of the recurring units. If the content of the recurring unit (1) is less than 5 mol %, the depth of focus of isolated space patterns tends to become narrow; if the content exceeds 50 mol %, the depth of focus of line-and-space patterns tends to become narrow.

The content of the recurring unit (2) is usually 10 to 70 mol %, preferably 20 to 60 mol %, and still more preferably 20 to 50 mol % of the total amount of the recurring units. If the content of the recurring unit (2) is less than 10 mol %, resolution as a resist tends to decrease. If the content exceeds 70 mol %, developability as a resist tends to decrease.

The content of the recurring unit (3) is usually 5 to 85 mol %, preferably 10 to 70 mol %, and still more preferably 15 to 60 mol % of the total amount of the recurring units.

The total content of the other recurring units is usually 50 mol % or less, and preferably 40 mol % or less, and still more preferably 30 mol % or less of the total content of the recurring units.

The copolymer [I] may be prepared by polymerizing the polymerizable unsaturated monomers corresponding to each recurring unit in an appropriate solvent in the presence of a chain transfer agent, as required, using a radical polymerization initiator such as hydroperoxides, dialkyl peroxides, diacyl peroxides, or azo compounds.

As examples of the solvent used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ketones such as 2-butanone, 4-methyl-2-pentanone, and 2-heptanone; and ethers such as tetrahydrofuran, dimethoxyethanes, and diethoxyethanes can be given.

These solvents may be used either individually or in combination of two or more.

The polymerization temperature is usually 40-120° C., and preferably 50-90° C. The reaction time is usually 1-48 hours, and preferably 1-24 hours.

The polystyrene-reduced weight average molecular weight of the copolymer [I] determined by gel permeation chromatography (GPC) (hereinafter referred to as "Mw") is 1,000 to 100,000, preferably 2,000 to 70,000, and still more preferably 2,000 to 20,000. If the Mw of the copolymer [I] is less than 1,000, heat resistance of the resulting resist tends to decrease. If the Mw exceeds 100,000, developability of the resulting resist decreases.

The ratio of Mw to the polystyrene-reduced number average molecular weight (hereinafter referred to as "Mn") determined by gel permeation chromatography (GPC) (Mw/Mn) of copolymer [I] is usually 1-5, and preferably 1-3.

It is preferable that the copolymer [I] contains almost no impurities such as halogens or metals. The smaller the amount of such impurities, the better are the sensitivity, resolution, process stability, pattern shape, or the like as a resist. The copolymer [I] can be purified using, for example, a chemical purification method such as washing with water or liquid-liquid extraction or a combination of the chemical purification method and a physical purification method such as ultrafiltration or centrifugation.

The copolymer [I] of the present invention is very suitable as a resin component of a radiation-sensitive resin composition used as a chemically-amplified resist for microfabrication using radiations represented by deep ultraviolet rays, particularly an ArF excimer laser.

Radiation-Sensitive Resin Composition

The radiation sensitive resin composition comprises (a) the copolymer [I] and (b) a photoacid generator as essential components.

The radiation-sensitive resin composition of the present invention will now be described.

(a) Copolymer [I]

As the copolymer [I] used in the radiation-sensitive resin composition of the present invention, a copolymer [I] containing recurring unit (1) in which $R^1$ in the formula (1) is a methyl group, recurring unit (2) in which $R^2$ in the formula (2) is a methyl group, and recurring unit (3) in which $R^3$ in the formula (3) is a methyl group, and optionally further containing at least one group selected from the recurring unit (4), recurring unit (5), recurring unit (6), recurring unit (7), and recurring unit (8) and a copolymer [I] containing recurring unit (1) in which m is 1 and m' is 2 in the formula (1), recurring unit (2), recurring unit (3) in which n in the formula (3) is 1, and optionally further containing at least one group selected from the recurring unit (4), recurring unit (5), recurring unit (6), recurring unit (7), and recurring unit (8) are preferable.

A particularly preferable copolymer [I] contains recurring unit (1) in which $R^1$ is a methyl group, m is 1, and m' is 2 in the formula (1), recurring unit (2) in which $R^2$ in the formula (2) is a methyl group, and recurring unit (3) in which $R^3$ is a methyl group and n is 1 in the formula (3), and optionally further containing at least one recurring unit selected from the recurring unit (4), recurring unit (5), recurring unit (6), recurring unit (7), and recurring unit (8).

The copolymer [I] can be used either individually or in combination of two or more in the radiation-sensitive resin composition of the present invention.

A lactone-containing copolymer (II), which is a resin insoluble or scarcely soluble in alkali, but becomes soluble in alkali by the action of an acid, comprising at least two recurring units selected from the recurring unit (1), recurring unit (2), and recurring unit (3), and at least one recurring unit selected from the recurring unit (4), recurring unit (5), recurring unit (6), recurring unit (7), and recurring unit (8) and having a polystyrene-reduced weight average molecular weight determined by gel permeation chromatography (GPC) of 1,000 to 100,000 (hereinafter referred to as "copolymer [III]") can be used in the radiation-sensitive resin composition of the present invention together with the copolymer [I].

In the copolymer [III], a methyl group is particularly preferable as $R^1$, 1 is particularly preferable as m, and 2 is particularly preferable as m' in the formula (1).

Either one type of recurring unit (1) may be present in the copolymer [III] or two or more different types of recurring units (1) may be present in the copolymer [III].

In addition, a particularly preferable $R^2$ in the formula (2) is a methyl group.

Either one type of recurring unit (2) may be present in the copolymer [III] or two or more different types of recurring units (2) may be present in the copolymer [III].

In the formula (3), a particularly preferable $R^3$ is a methyl group and particularly preferable n is 1.

Either one type of recurring unit (3) may be present in the copolymer [III] or two or more different types of recurring units (3) may be present in the copolymer [III].

The content of each recurring unit in the copolymer [III] is as follows.

The total content of the recurring units (1), (2), and (3) is usually 20 to 80 mol %, preferably 20 to 70 mol %, and still more preferably 30 to 60 mol % of the total recurring units.

The total content of the recurring units (4) to (8) is usually 20 to 80 mol %, preferably 30 to 80 mol %, and still more preferably 40 to 70 mol % of the total recurring units.

The copolymer [III] can be used either individually or in combination of two or more in the radiation-sensitive resin composition of the present invention.

The copolymer [III] can be prepared in the same manner as the copolymer [I].

When the copolymer [III] is used together with the copolymer [I], the proportion of the copolymer [I] to the total amount of the copolymer [I] and copolymer [III] is preferably 30 to 90 wt %, and still more preferably 40 to 80 wt %.

(b) Photoacid Generator

The photoacid generator used in the radiation sensitive resin composition of the present invention is obtained from a component that produces an acid in response to irradiation (hereinafter, referred to as "exposure") using radioactive rays such as deep ultraviolet rays, X-rays, and electron beams (hereinafter, referred to as "(b) acid generator"). As examples of the acid generator (b), onium salt compounds such as sulfonium salt and iodium salt, organohalide compounds, sulfone compounds such as disulfones and diazomethanesulfones, and the like can be given.

As preferable examples of the photoacid generator (b), triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-(bicyclo[2.2.1]heptan-2-yl)-1,1,2,2-tetrafluoroethanesulfonate, and triphenylsulfonium 10-camphorsulfonate; 4-cyclohexylphenyldiphenylsulfonium salt compounds such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-(bicyclo[2.2.1]heptan-2-yl)-1,1,2,2-tetrafluoroethanesulfonate, and 4-cyclohexylphenyldiphenylsulfonium 10-camphorsulfonate; 4-methanesulfonylphenyldiphenylsulfonium salt compounds such as 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-(bicyclo[2.2.1]heptan-2-yl)-1,1,2,2-tetrafluoroethanesulfonate, and 4-methanesulfonylphenyldiphenylsulfonium 10-camphorsulfonate; diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium 2-(bicyclo[2.2.1]heptan-2-yl)-1,1,2,2-tetrafluoroethanesulfonate, and diphenyliodonium 10-camphorsulfonate; bis(4-t-butylphenyl)iodonium salt compounds such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-(bicyclo[2.2.1]heptan-2-yl)-1,1,2,2-tetrafluoroethanesulfonate, and bis(4-t-butylphenyl)iodonium 10-camphorsulfonate; 1-(4-n-butoxynaphthalen-1-yl)tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-(bicyclo[2.2.1]heptan-2-yl)-1,1,2,2-tetrafluoroethanesulfonate, and 1-(4-n-butoxynaphthalen-1-yl)tetrahydrothiophenium 10-camphorsulfonate; 1-(6-n-butoxynaphthalen-2-yl) tetrahydrothiophenium salt compounds such as 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl) tetrahydrothiophenium perfluoro-n-octanesulfonate, 1-(6-n-butoxynaphthalen-2-yl)tetrahydrothiophenium 2-(bicyclo[2.2.1]heptan-2-yl)-1,1,2,2-tetrafluoroethanesulfonate, and 1-(6-n-butoxynaphthalen-2-yl)tetrahydrothiophenium 10-camphorsulfonate; 1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-(bicyclo[2.2.1]heptan-2-yl)-1,1,2,2-tetrafluoroethanesulfonate, and 1-(3,5-dimethyl-4-hydroxyphenyl)tetrahydrothiophenium 10-camphorsulfonate; bicyclo[2.2.1]hept-5-ene-2,3-dicarboxyimide compounds such as N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-[2-(bicyclo[2.2.1]heptan-2-yl)-1,1,2,2-tetrafluoroethanesulfonyloxy]bicyclo[2.2.1]hept-5-ene-2,3-dicarboxyimide, N-[2-(tetracyclo[4.4.0.1$^{2,5}$.1$^{7,10}$]dodecan-3-yl)-1,1-difluoroethanesulfonyloxy]bicyclo[2.2.1]hept-5-ene-2,3-dicarboxyimide, and N-(10-camphorsulfonyloxy)bicyclo[2.2.1]hept-5-ene-2,3-dicarboxyimide; and the like can be given.

These photoacid generators (b) may be used either individually or in combination of two or more. The amount of the photoacid generator (b) used in the present invention is usually 0.1-20 parts by weight, and preferably 0.1-15 parts by weight for 100 parts by weight of the (a) copolymer [I] in order to ensure sensitivity and resolution of the resulting resist. If the amount of the photoacid generator (b) is less than 0.1 part by weight, sensitivity and resolution tend to decrease. If the amount exceeds 20 parts by weight, a rectangular resist pattern may not be obtained due to decreased radiation transmittance.

Additives

An acid diffusion controller is preferably added to the radiation-sensitive resin composition of the present invention. The acid diffusion controller controls diffusion of an acid generated from the photoacid generator (b) upon exposure in the resist film and prevents unfavorable chemical reactions in the unexposed region.

By the addition of this acid diffusion controller, in addition to improving the storage stability of the obtained radiation sensitive resin composition and further increasing the resolution as a resist, line width change of the resist pattern resulting from fluctuation in delay time between irradiation and processing procedure (PED) can be suppressed, and not only can a composition exhibiting extremely excellent process stability be obtained, variation in solubility from the upper portion to the lower portion of the pattern can be suppressed, in particular, T-top phenomenon in the upper portion of the pattern and undissolved matter in the lower portion of the pattern can be suppressed.

Although there are no particular limitations to the acid diffusion controller as long as it is a compound that possesses sufficiently strong affinity with an acid, those that do not exhibit change in basicity in steps such as resist coating baking, irradiation, and development are preferable, for example, a compound shown by the following formula (9) (hereinafter, referred to as "compound (9)"), tertiary amine compound, amide group-containing compound, quarternary ammonium hydroxide compound, nitrogen-containing heterocyclic compound, and the like can be given.

(9)

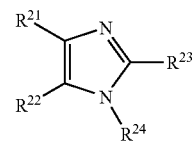

$R^{21}$ and $R^{22}$ individually represent a hydrogen atom, a linear, branched, or cyclic alkyl group having 1-6 carbon atoms or a monovalent aromatic hydrocarbon group, or $R^{21}$ and $R^{22}$ bind to form a divalent alicyclic hydrocarbon group having 4-12 carbon atoms, $R^{23}$ represents a hydrogen atom, a linear, branched, or cyclic alkyl group having 1-6 carbon atoms, or a group —COOR$^{25}$ (given that $R^{25}$ is a hydrogen atom or a linear, branched, or cyclic alkyl group having 1-6 carbon atoms), and $R^{24}$ represents a hydrogen atom, a linear, branched, or cyclic alkyl group having 1-6 carbon atoms, a monovalent alicyclic hydrocarbon group having 6-12 carbon atoms, or a monovalent aromatic hydrocarbon group having 6-12 carbon atoms, wherein the alkyl group, monovalent alicyclic hydrocarbon group, and monovalent aromatic hydrocarbon group may be substituted.

As specific examples of groups other than the hydrogen atom of $R^{21}$ and $R^{22}$ in the formula (12), a methyl group, ethyl group, n-propyl group, i-propyl group, n-butyl group, 2-methylpropyl group, 1-methylpropyl group, t-butyl group, cyclopentyl group, cyclohexyl group, cycloheptyl group, phenyl group, 1-naphthyl group, and the like can be given.

As specific examples of groups other than the hydrogen atom of $R^{23}$, a methyl group, ethyl group, n-propyl group, i-propyl group, n-butyl group, 2-methylpropyl group, 1-methylpropyl group, t-butyl group, cyclopentyl group, cyclohexyl group, hydroxycarbonyl group, methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, cyclopentyloxycarbonyl group, cyclohexyloxycarbonyl group, and the like can be given.

As specific examples of groups other than the hydrogen atom of $R^{24}$, a methyl group, ethyl group, n-propyl group, i-propyl group, n-butyl group, i-butyl group, sec-butyl group, t-butyl group, cyclopentyl group, cyclohexyl group, cycloheptyl group, phenyl group, 1-naphthyl group, and the like can be given.

As specific examples of the compound (9), imidazole, 4-methylimidazole, 1-benzyl-2-methylimidazole, 4-methyl-2-phenylimidazole, benzimidazole, 2-phenylbenzimidazole, N-t-butoxycarbonylbenzimidazole, N-t-butoxycarbonyl-2-methylbenzimidazole, N-t-butoxycarbonyl-2-phenylbenzimidazole, and the like can be given.

As examples of the tertiary amine compound, tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyldimethylamine, dicyclohexylmethylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, and 2,6-di(i-propyl)aniline; alkanolamines such as triethanolamine and N,N-di(2-hydroxyethyl)aniline; N,N,N',N'-tetramethylethylenediamine, N,N,N',N'-tetrakis(2-hydroxypropyl) ethylenediamine, 1,3-bis[1-(4-aminophenyl)-1-methylethyl]benzenetetramethylenediamine, bis(2-dimethylaminoethyl)ether, bis(2-diethylaminoethyl)ether, and the like can be given.

As examples of the amide group-containing compound, N-t-butoxycarbonyl group-containing amino compounds such as N-t-butoxycarbonyldi-n-octylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonyloxamethylenediamine, 1-(t-butoxycarbonyl)-2-pyrrolidinemethanol, t-butyl (tetrahydro-2-oxa-3-furanyl)carbamate, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole can be given.

As examples of the quaternary ammonium hydroxide compound, tetra-n-propylammonium hydroxide, and tetra-n-butylammonium hydroxide can be given.

As examples of the nitrogen-containing heterocyclic compounds, pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; pyrazine, pyrazole, pyridazine, quinoxaline, purine, pyrrolidine, t-butyl (pyrrolidin-1-nyl)acetate, piperidine, t-butyl (4-hydroxypiperidin-1-nyl)acetate, piperidine-3-piperidino-1,2-propanediol, morpholine, 4-methylmorpholine, 1,4-dimethylpiperazine, and 1,4-diazabicyclo[2.2.2]octane; and the like can be given.

The acid diffusion controllers may be used either individually or in combination of two or more.

The amount of the acid diffusion controller to be added is usually 15 parts by weight or less, preferably 10 parts by weight or less, and still more preferably 5 parts by weight or less for 100 parts by weight of the (a) copolymer [I]. If the amount of the acid diffusion controllers exceeds 15 parts by weight, sensitivity as a resist tends to decrease. If the amount is less than 0.001 part by weight, the pattern shape or dimensional accuracy as a resist may decrease depending on the processing conditions.

Alicyclic additives having an acid-dissociable group and alicyclic additives having no acid-dissociable group may be added to the radiation-sensitive resin composition of the present invention.

The alicyclic additives having an acid-dissociable group and alicyclic additives having no acid-dissociable group improve dry etching resistance, pattern shape, and adhesion to the substrate. As examples of such alicyclic additives, adamantane derivatives such as t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[4.4.0.1$^{2,5}$.1$^{7,10}$]dodecane and the like can be given.

These alicyclic additives may be used either individually or in combination of two or more.

The amount of the alicyclic additives to be added is usually 50 parts by weight or less, and preferably 30 parts by weight or less for 100 parts by weight of the (a) copolymer [I]. If the amount of the alicyclic additives exceeds 50 parts by weight, heat resistance as a resist tends to decrease.

A surfactant that improves applicability, striation, developability, and the like may be added to the radiation sensitive resin composition of the present invention.

As the surfactants, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), EFTOP EF301, EF303, EF352 (manufactured by JEMCO, Inc.), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S382, SC101, SC102, SC103, SC104, SC105, SC106 (manufactured by Asahi Glass Co., Ltd.), and the like can be given.

The surfactants may be used either individually or in combination of two or more.

The amount of surfactants to be added is usually two parts by weight or less for 100 parts by weight of the (a) copolymer [I].

A photosensitizer which improves sensitivity and the like may be added to the radiation-sensitive resin composition of the present invention.

As examples of photosensitizers, carbazoles, benzophenones, rose bengals, anthracenes, and phenols can be given.

These sensitizers may be used either individually or in combination of two or more.

The amount of sensitizers to be added is usually 50 parts by weight or less for 100 parts by weight of the (a) copolymer [I].

As examples of other additives, halation inhibitors, adhesion promoters, storage stabilizers, anti-foaming agents, and the like can be given.

The radiation-sensitive resin composition of the present invention is usually made into a composition solution by dissolving the composition in a solvent so that the total solid content is usually from 3 to 50 wt %, and preferably from 5 to 25 wt %, and filtering the solution using a filter with a pore diameter of about 200 nm, for example.

As solvents used for preparing the composition solution, 2-hexanone, 2-heptanone, 2-octanone, cyclopentanone, cyclohexanone, propylene glycol monomethyl ether acetate, propylene glycol monoethyl ether acetate, methyl 2-hydroxypropionate, ethyl 2-hydroxypropionate, methyl 3-ethoxypropionate, ethyl 3-ethoxypropionate, ethylene glycol monomethyl ether, ethylene glycol monoethyl ether, diethylene glycol dimethyl ether, diethylene glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, diethylene glycol monomethyl ether, diethylene glycol monoethyl ether, γ-butyrolactone, and the like can be given.

These solvents may be used either individually or in combination of two or more. Of the above examples, 2-heptanone, cyclohexanone, propylene glycol monomethyl ether acetate, ethyl 2-hydroxypropionate, ethyl 3-ethoxypropionate, propylene glycol monomethyl ether, γ-butyrolactone, and the like are preferable, with solvents containing at least propylene glycol monomethyl ether acetate and/or propylene glycol monomethyl ether being even more preferable.

The radiation-sensitive resin composition of the present invention is particularly useful as a chemically-amplified resist.

In the chemically-amplified resist, at least a portion of the acid dissociable group of the (a) copolymer [I] dissociates by the action of an acid produced from the photoacid generator (b) by irradiation, the solubility of the alkali developer of the irradiated portion of the resist increases, and the irradiated portion is removed by dissolution by the alkali developer to obtain a positive-tone resist pattern.

When forming a resist pattern using the radiation sensitive resin composition of the present invention, a resist coating is formed by applying the composition solution to the substrate of a silicon wafer, for example, using an appropriate application means such as spinning application, flow application, roll application, and spray application, and the resist coating is prebaked (hereinafter, referred to as "PB") when necessary and irradiated to form a specified resist pattern.

As examples of the radiation used, deep ultraviolet rays such as KrF excimer laser (wavelength: 248 nm), ArF excimer laser (wavelength: 193 nm), $F_2$ excimer laser (wavelength: 157 nm), or EUV (extreme ultraviolet, wavelength: 13 nm), X-rays such as synchrotron radiation, and charged particle rays such as electron beams can be given.

The exposure conditions such as the light exposure are appropriately determined depending on the composition of the radiation-sensitive resin composition, types of additives, and the like.

It is preferable to perform post exposure bake (hereinafter called "PEB") in order to stably form a highly-accurate minute pattern.

The heating temperature for the PEB is usually 30-200° C., and preferably 50-170° C., although the heating conditions are changed depending on the composition of the radiation-sensitive resin composition.

In order to bring out maximum potentiality of the radiation-sensitive resin composition of the present invention, an organic or inorganic anti-reflection film may be formed on a substrate as disclosed in Patent Document 3, for example. Moreover, a protection film may be formed on the resist film as disclosed in Patent Document 4, for example, in order to prevent the effects of basic impurities and the like in an environmental atmosphere. These techniques may be employed in combination.

Patent Document 3: JP-B-6-12452
Patent Document 4: JP-A-5-188598

The exposed resist film is then developed to form a prescribed resist pattern.

An alkaline aqueous solution in which tetramethylammonium hydroxide is dissolved, for example, is preferable as the developer used for development.

The concentration of the alkaline aqueous solution is usually 1-10 wt % or less. If the concentration of the alkaline aqueous solution exceeds 10 wt %, an unexposed area may also be dissolved in the developer. In addition, surfactants or the like may be added to the developer containing the alkaline aqueous solution in an appropriate amount.

After development using the alkaline aqueous solution developer, the resist film is generally washed with water and dried.

BEST MODE FOR CARRYING OUT THE INVENTION

The present invention is described below in more detail by examples. However, these examples should not be construed as limiting the present invention.

Measurement and evaluation in the Synthesis Examples were carried out as follows.

$^{13}$C-NMR analysis of each of the copolymers was conducted using JNM-EX270 (manufactured by JEOL Ltd.) and $CDCl_3$ as a measuring solvent.

The Mw of each of the copolymers was measured by gel permeation chromatography (GPC) using GPC columns (manufactured by Tosoh Corp., G2000HXL×2, G3000HXL×1, G4000HXL×1) under the following conditions: Flow rate: 1.0 ml/min., eluate: tetrahydrofuran, column temperature: 40° C., standard reference material: monodispersed polystyrene.

Synthesis Example 1

A monomer solution was prepared by dissolving 9.84 g (20 mol %) of a compound shown by the following formula (1-1) (hereinafter "compound (1-1)"), 22.06 g (40 mol %) of a compound shown by the following formula (2-1) (hereinafter "compound (2-1)"), and 18.10 g (40 mol %) of a compound shown by the following formula (3-1) (hereinafter "compound (3-1)") in 100 g of 2-butanone, and further adding 2.86 g of dimethyl 2,2'-azobis(2-methylpropionate).

The monomer solution was added dropwise to 50 g of 2-butanone at 80° C. over 3 hours in a nitrogen atmosphere. After the addition, the reaction mixture was polymerized with stirring for 3 hours. After the polymerization, the reaction solution was cooled to room temperature and poured into 1,000 g of i-propanol. White precipitate produced was collected by filtration. The white powder obtained by filtration was washed with 200 g of i-propanol twice in a form of slurry, collected by filtration, and dried at 60° C. for 15 hours to obtain 38 g of a white powder of copolymer [I] (yield: 76 wt %).

The resulting copolymer [I] was a copolymer with an Mw of 8,800 and the mol ratio of the recurring units derived from the compound (1-1), compound (2-1), and compound (3-1) determined by $^{13}$C NMR was 19.5:43.1:37.4. This copolymer [I] is referred to as "copolymer (a-1)".

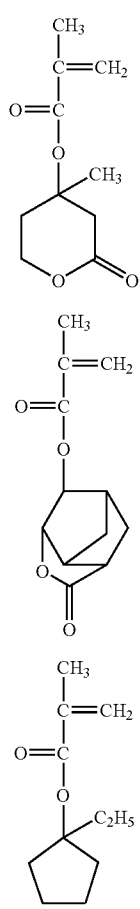

(1-1)

(2-1)

(3-1)

Synthesis Example 2

A monomer solution was prepared by dissolving 4.96 g (10 mol %) of compound (1-1), 22.24 g (40 mol %) of compound (2-1), and 22.80 g (50 mol %) of compound (3-1) in 100 g of 2-butanone, and further adding 2.88 g of dimethyl 2,2'-azobis (2-methylpropionate).

The monomer solution was added dropwise to 50 g of 2-butanone at 80° C. over 3 hours in a nitrogen atmosphere. After the addition, the reaction mixture was polymerized with stirring for 3 hours. After the polymerization, the reaction solution was cooled to room temperature and poured into 1,000 g of methanol. White precipitate produced was collected by filtration. The white powder obtained by filtration was washed with 200 g of methanol twice in a form of slurry, collected by filtration, and dried at 60° C. for 15 hours to obtain 35 g of a white powder of copolymer [I] (yield: 70 wt %).

The resulting copolymer [I] was a copolymer with an Mw of 7,800 and the mol ratio of the recurring units derived from the compound (1-1), compound (2-1), and compound (3-1) determined by $^{13}$C NMR was 9.7:42.6:47.7. This copolymer [I] is referred to as "copolymer (a-2)".

Synthesis Example 3

A monomer solution was prepared by dissolving 4.86 g (10 mol %) of compound (1-1), 27.26 g (50 mol %) of compound (2-1), and 17.88 g (40 mol %) of compound (3-1) in 100 g of 2-butanone, and further adding 2.88 g of dimethyl 2,2'-azobis (2-methylpropionate).

The monomer solution was added dropwise to 50 g of 2-butanone at 80° C. over 3 hours in a nitrogen atmosphere. After the addition, the reaction mixture was polymerized with stirring for 3 hours. After the polymerization, the reaction solution was cooled to room temperature and poured into 1,000 g of methanol. White precipitate produced was collected by filtration. The white powder obtained by filtration was washed with 200 g of methanol twice in a form of slurry, collected by filtration, and dried at 60° C. for 15 hours to obtain 38 g of a white powder of copolymer [I] (yield: 76 wt %).

The resulting copolymer [I] was a copolymer with an Mw of 7,600 and the mol ratio of the recurring units derived from the compound (1-1), compound (2-1), and compound (3-1) determined by $^{13}$C NMR was 9.8:53.6:36.6. This copolymer [I] is referred to as "copolymer (a-3)".

Synthesis Example 4

A monomer solution was prepared by dissolving 26.33 g (16 mol %) of a compound shown by the following formula (5-1) (hereinafter "compound (5-1)"), 37.56 g (37 mol %) of the compound (2-1), and 36.11 g (47 mol %) of a compound shown by the following formula (3-2) (hereinafter "compound (3-2)") in 200 g of 2-butanone, and further adding 4.20 g of dimethyl 2,2'-azobis(2-methylpropionate).

The monomer solution was added dropwise to 100 g of 2-butanone at 80° C. over 2 hours in a nitrogen atmosphere. After the addition, the reaction mixture was polymerized with stirring for 8 hours. After the polymerization, the reaction solution was cooled to room temperature and poured into 2,000 g of n-hexane. White precipitate produced was collected by filtration. The white powder obtained by filtration was washed with 200 g of n-hexane twice in a form of slurry, collected by filtration, and dried at 60° C. for 17 hours to obtain 71 g of a white powder of copolymer [II] (yield: 71 wt %).

The resulting copolymer [II] was a copolymer with an Mw of 12,100 and the mol ratio of the recurring units derived from the compound (5-1), compound (2-1), and compound (3-2) determined by $^{13}$C NMR was 15.1:39.1:45.8 (mol %). This copolymer [II] is referred to as "copolymer (a-4)".

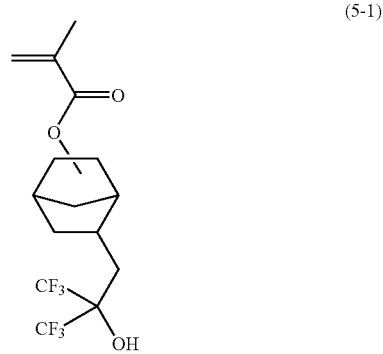

(5-1)

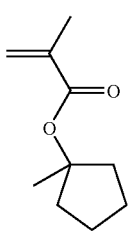

(3-2)

Synthesis Example 5

A monomer solution was prepared by dissolving 20.00 g (40 mol %) of compound (2-1), 5.33 g (13 mol %) of compound (3-1), and 19.51 g (37 mol %) of a compound shown by the following formula (4-1) (hereinafter "compound (4-1)") in 100 g of 2-butanone, and further adding 1.85 g of dimethyl 2,2'-azobisisobutylonitrile.

The monomer solution was added dropwise to 50 g of 2-butanone at 80° C. over 3 hours in a nitrogen atmosphere. After the addition, the reaction mixture was polymerized with stirring for 3 hours. After the polymerization, the reaction solution was cooled to room temperature and poured into 1,000 g of i-propanol. White precipitate produced was collected by filtration. The white powder obtained by filtration was washed with 200 g of i-propanol twice in a form of slurry, collected by filtration, and dried at 60° C. for 15 hours to obtain 38 g of a white powder of copolymer [II] (yield: 77 wt %).

The resulting copolymer [II] was a copolymer with an Mw of 5,800 and the mol ratio of the recurring units derived from the compound (2-1), compound (3-1), and compound (4-1) determined by $^{13}$C NMR was 43.0:13.6:43.4. This copolymer [II] is referred to as "copolymer (a-5)".

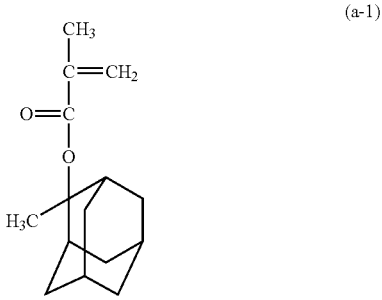

(a-1)

Comparative Synthesis Example 1

A monomer solution was prepared by dissolving 24.30 g (50 mol %) of compound (2-1), 10.34 g (20 mol %) of a compound shown by the following formula (6-1) (hereinafter "compound (6-1)"), and 15.36 g (30 mol %) of compound (4-1) in 100 g of 2-butanone, and further adding 2.02 g of dimethyl 2,2'-azobis(2-methylpropionate).

The monomer solution was added dropwise to 50 g of 2-butanone at 80° C. over 3 hours in a nitrogen atmosphere. After the addition, the reaction mixture was polymerized with stirring for 3 hours. After the polymerization, the reaction solution was cooled to room temperature and poured into 1,000 g of methanol. White precipitate produced was collected by filtration. The white powder obtained by filtration was washed with 200 g of methanol twice in a form of slurry, collected by filtration, and dried at 60° C. for 15 hours to obtain 37 g of a white powder of a copolymer (yield: 74 wt %).

The resulting copolymer was a copolymer with an Mw of 9,200 and the mol ratio of the recurring units derived from the compound (2-1), compound (6-1), and compound (4-1) determined by $^{13}$C NMR was 55.7:18.3:26.0. This copolymer is referred to as a "copolymer (α-1)".

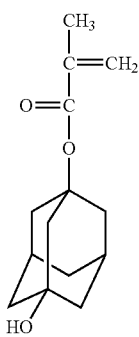

(6-1)

Comparative Synthesis Example 2

A monomer solution was prepared by dissolving 20.00 g (40 mol %) of compound (2-1), 5.74 g (14 mol %) of compound (3-1), and 24.26 g (46 mol %) of compound (4-1) in 100 g of 2-butanone, and further adding 2.59 g of dimethyl 2,2'-azobis(2-methylpropionate).

The monomer solution was added dropwise to 50 g of 2-butanone at 80° C. over 3 hours in a nitrogen atmosphere. After the addition, the reaction mixture was polymerized with stirring for 3 hours. After the polymerization, the reaction solution was cooled to room temperature and poured into 1,000 g of i-propanol. White precipitate produced was collected by filtration. The white powder obtained by filtration was washed with 200 g of i-propanol twice in a form of slurry, collected by filtration, and dried at 60° C. for 15 hours to obtain 38 g of a white powder of copolymer [II] (yield: 77 wt %).

The resulting copolymer [II] was a copolymer with an Mw of 5,800 and the mol % ratio of the recurring units derived from the compound (2-1), compound (3-1), and compound (4-1) determined by $^{13}$C NMR was 43.0:13.6:43.4. This copolymer [II] is referred to as "copolymer (a-6)".

Examples 1-6 and Comparative Examples 1-2

After preparing composition solutions by mixing the components shown in Table 1, in which "part" indicates "part by weight", resist patterns were prepared to conduct various evaluations. The evaluation results are shown in Table 3.

In Table 1, the acid generators (b), acid diffusion controllers and solvents are as follows.

Acid Generator (b)
 b-1: Triphenylsulfonium nonafluoro-n-butanesulfonate
 b-2: 4-cyclohexylphenyldiphenylsulfonium nonafluoro-n-butanesulfonate,
 b-3: 1-(4-n-butoxynaphthalen-1-yl)tetrahydrothiophenium nonafluoro-n-butanesulfonate Acid Diffusion Controller
 C-1: t-butyl(pyrrolidin-1-yl)acetate Solvent
  S-1: Propylene glycol monomethyl ether acetate
  S-2: Cyclohexanone The evaluation method in Examples and Comparative Examples are as follows.

Sensitivity

The composition solutions were applied by spin coating to the surface of silicon wafers (indicated as "ARC29" in Table 2) on which a film with a thicknesses of 77 nm ("ARC29" manufactured by Brewer Science, Inc.) was formed. After PB was conducted on a hot plate under the conditions shown in Table 2, the coating was cooled to obtain a resist film with a thickness of 0.3 μm. The resist film was exposed to radiation through a mask pattern using an ArF excimer laser exposure apparatus (numerical aperture: 0.75) while changing the radiation dose. After performing PEB under the conditions shown in Table 2 and cooling, the resist film was developed at 23° C. for 30 seconds in a 2.38 wt % tetramethylammonium hydroxide aqueous solution, washed with water, and dried to form a positive-tone resist pattern. Application of the composition solutions, PB, development, and PEB were carried out using "ACT8" manufactured by Tokyo Electron Ltd. An optimum dose at which a 1:1 line-and-space (1L1S) pattern with a line width of 90 nm was formed was taken as sensitivity.

Resolution

The dimension of the minimum line and space (1L1S) pattern resolved by an optimum does of irradiation was taken as the resolution.

Line Width Limit

A resist pattern was formed according to the method of evaluating sensitivity while changing the dose from the optimum dose. The minimum line width of the line pattern obtained without falling when the line width of the line pattern was narrowed was measured using a scanning electron microscope for measurement of length ("S9360" manufactured by Hitachi, Ltd.).

Common DOF

A resist pattern was formed according to the method of evaluating sensitivity using an exposure mask capable of simultaneously forming a line-and-space pattern (1L1S) with a line width of 100 nm and an isolated space pattern with a space width of 110 nm on one piece of wafer. In this instance, the range of depth of focus in which the line width of the line-and-space pattern (1L1S) was 81 to 99 nm and the space width of the isolated space pattern was 100 to 120 nm was measured.

PEB Temperature Dependency

Line-and-Space with a Line Width of 90 nm

A line-and-space pattern (1L1S) with a line width of 90 nm was formed at an optimum dose to measure the line width by inspecting the resulting line pattern from the upper part by a scanning electron microscope for measurement of length ("S9360" manufactured by Hitachi, Ltd.). The PEB temperature dependency was evaluated according to the following formula, wherein ΔW1 indicates difference of the line width between the one when the PEB temperature was increased 2° C. from the PEB temperature shown in Table 2 and the one when the PEB temperature shown in Table 2 was used and ΔW2 indicates difference of the line width between the one when the PEB temperature was decreased 2° C. from the PEB temperature shown in Table 2 and the one when the PEB temperature shown in Table 2 was used.

PEB temperature dependency(nm/° C.)=(|ΔW1|+|ΔW2|)/4

TABLE 1

| | Copolymer (part) | Acid generator (b) (part) | Acid diffusion controller (part) | Solvent (part) |
|---|---|---|---|---|
| Example 1 | a-1 (100) | b-1 (1.5) b-2 (4.0) | C-1 (0.55) | S-1 (450) S-2 (150) |
| Example 2 | a-2 (100) | b-1 (1.5) b-2 (4.0) | C-1 (0.55) | S-1 (450) S-2 (150) |
| Example 3 | a-3 (100) | b-1 (1.5) b-2 (4.0) | C-1 (0.55) | S-1 (450) S-2 (150) |
| Example 4 | a-2 (40) a-6 (60) | b-1 (1.5) b-3 (6.0) | C-1 (0.55) | S-1 (450) S-2 (150) |
| Example 5 | a-2 (80) a-4 (20) | b-1 (3.0) b-3 (4.0) | C-1 (0.55) | S-1 (450) S-2 (150) |
| Example 6 | a-2 (70) a-5 (30) | b-1 (2.5) b-3 (4.0) | C-1 (0.55) | S-1 (450) S-2 (150) |
| Comparative Example 1 | α-1 (100) | b-1 (1.5) b-2 (4.0) | C-1 (0.55) | S-1 (450) S-2 (150) |
| Comparative Example 2 | a-6 (100) | b-1 (1.5) b-2 (4.0) | C-1 (0.55) | S-1 (450) S-2 (150) |

TABLE 2

| | Resist film thickness (μm) | Substrate | PB Temp. (° C.) | PB Time (sec) | PEB Temp. (° C.) | PEB Time (sec) |
|---|---|---|---|---|---|---|
| Example 1 | 0.3 | ARC29 | 110 | 90 | 110 | 90 |
| Example 2 | 0.3 | ARC29 | 110 | 90 | 110 | 90 |
| Example 3 | 0.3 | ARC29 | 110 | 90 | 110 | 90 |
| Example 4 | 0.3 | ARC29 | 110 | 90 | 110 | 90 |
| Example 5 | 0.3 | ARC29 | 110 | 90 | 110 | 90 |
| Example 6 | 0.3 | ARC29 | 110 | 90 | 110 | 90 |
| Comparative Example 1 | 0.3 | ARC29 | 130 | 90 | 130 | 90 |
| Comparative Example 2 | 0.3 | ARC29 | 110 | 90 | 110 | 90 |

TABLE 3

| | Sensitivity (J/m²) | Resolution (μm) | Line width limit (μm) | Common DOF (μm) | PEB temperature dependency (nm/° C.) |
|---|---|---|---|---|---|
| Example 1 | 430 | 0.085 | 0.060 | 0.45 | 2.5 |
| Example 2 | 425 | 0.085 | 0.065 | 0.45 | 2.0 |
| Example 3 | 430 | 0.085 | 0.070 | 0.40 | 2.3 |
| Example 4 | 420 | 0.085 | 0.070 | 0.40 | 2.4 |
| Example 5 | 425 | 0.085 | 0.065 | 0.40 | 2.2 |
| Example 6 | 425 | 0.085 | 0.070 | 0.45 | 2.5 |
| Comparative Example 1 | 410 | 0.090 | 0.085 | 0.10 | 5.4 |
| Comparative Example 2 | 415 | 0.090 | 0.090 | 0.20 | 4.1 |

As shown in Table 3, the radiation-sensitive resin composition not only excels in basic properties as a resist such as sensitivity, resolution, and the like, but also has outstanding effects of exhibiting a small line width limit in which the line pattern destroying phenomenon does not occur, wide common DOF to both a line-and-space pattern and an isolated space pattern, and a minimal line width change due to fluctuation of a bake temperature.

INDUSTRIAL APPLICABILITY

When used particularly as a chemically amplified resist, the radiation-sensitive resin composition of the present invention has high transparency to radiations, excels in basic properties as a resist such as sensitivity, resolution, and the like, has a wide common depth of focus (common DOF) which is common to both a line-and-space pattern and an isolated space pattern, exhibits a minimal line width change due to fluctuation of a bake temperature, and has a small line width limit in which the line pattern destroying phenomenon does not occur. The resin composition can stably form high precision resist patterns.

The copolymer (I) of the present invention is particularly suitable for use as a resin component for the radiation-sensitive resin composition of the present invention.

The invention claimed is:

1. A lactone-containing copolymer [I] which is a resin insoluble or scarcely soluble in alkali, but becomes alkali-soluble by the action of an acid, has a recurring unit shown by the following formula (1), a recurring unit shown by the following formula (2), and a recurring unit shown by the following formula (3), and has a polystyrene-reduced weight average molecular weight determined by gel permeation chromatography (GPC) of 1,000 to 100,000,

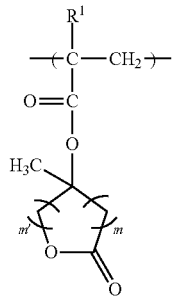

(1)

wherein $R^1$ represents a hydrogen atom, methyl group, trifluoromethyl group, or hydroxymethyl group and m and m' are independently an integer of 1 to 3,

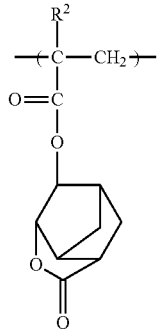

(2)

wherein $R^2$ represents a hydrogen atom, methyl group, trifluoromethyl group, or hydroxymethyl group, and

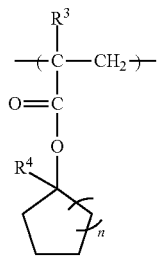

(3)

wherein $R^3$ represents a hydrogen atom, methyl group, trifluoromethyl group, or hydroxymethyl group, and $R^4$ indicates a linear or branched alkyl group having 1 to 4 carbon atoms, and n is 1.

2. The lactone-containing copolymer [I] according to claim 1, wherein the $R^1$ in the formula (1), the $R^2$ in the formula (2), and the $R^3$ in the formula (3) are a methyl group.

3. The lactone-containing copolymer [I] according to claim 1, wherein m and m' in the formula (1) are respectively 1 and 2 and n in the formula (3) is 1.

4. The lactone-containing copolymer [I] according to claim 1, wherein the $R^1$ in the formula (1), the $R^2$ in the formula (2), and the $R^3$ in the formula (3) are a methyl group, m and m' in the formula (1) are respectively 1 and 2, and n in the formula (3) is 1.

5. A radiation-sensitive resin composition comprising (a) the lactone-containing copolymer [I] according to claim 1 and (b) a photoacid generator.

6. The radiation sensitive resin composition according to claim 5, wherein the amount of the recurring unit of the formula (1), the recurring unit of the formula (2), and the recurring unit of the formula (3) are respectively 5 to 40 mol %, 20 to 60 mol %, and 10 to 70 mol % of all recurring units in the lactone-containing copolymer [I].

7. The radiation-sensitive resin composition according to claim 5, wherein (b) the photoacid generator is an onium salt.

8. The radiation-sensitive resin composition according to claim 6, wherein (b) the photoacid generator is an onium salt.

9. A radiation-sensitive resin composition comprising (a) a mixture of a lactone-containing copolymer (I), which is a resin insoluble or scarcely soluble in alkali, but becomes soluble in alkali by the action of an acid, comprising a recurring unit shown by the following formula (1), a recurring unit shown by the following formula (2), and a recurring unit shown by the following formula (3) and having a polystyrene-reduced weight average molecular weight determined by gel permeation chromatography (GPC) of 1,000 to 100,000, and a lactone-containing copolymer (II), which is a resin insoluble or scarcely soluble in alkali, but becomes soluble in alkali by the action of an acid, comprising at least two recurring units selected from the recurring unit shown by the following formula (1), the recurring unit shown by the following formula (2), and the recurring unit shown by the following formula (3), and at least one recurring unit selected from a recurring unit shown by the following formula (4), a recurring unit shown by the following formula (5), a recurring unit shown by the following formula (6), a recurring unit shown by the following formula (7), and a recurring unit shown by the following formula (8) and having a polystyrene-reduced weight average molecular weight determined by gel permeation chromatography (GPC) of 1,000 to 100,000, and (b) a photoacid generator,

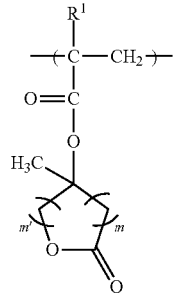

(1)

wherein $R^1$ represents a hydrogen atom, methyl group, trifluoromethyl group, or hydroxymethyl group and m and m' are independently an integer of 1 to 3, (2)

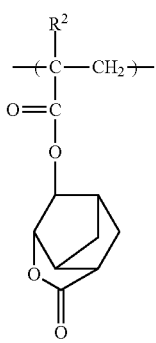

wherein R² represents a hydrogen atom, methyl group, trifluoromethyl group, or hydroxymethyl group, (3)

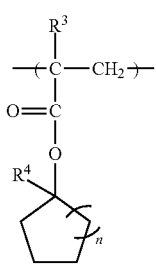

wherein R³ represents a hydrogen atom, methyl group, trifluoromethyl group, or hydroxymethyl group, and R⁴ indicates a linear or branched alkyl group having 1 to 4 carbon atoms, and n is 1, (4)

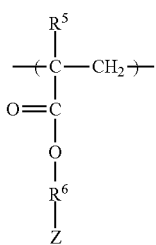

wherein R⁵ represents a hydrogen atom, a methyl group, a trifluoromethyl group, or a hydroxymethyl group, R⁶ represents a linear or branched alkylene group having 1 to 4 carbon atoms in the main chain or a divalent alicyclic hydrocarbon group having 3 to 20 carbon atoms, and Z represents a hydrogen atom, a hydroxyl group, a cyano group, or a linear, branched, or cyclic hydroxyalkyl group having 1 to 10 carbon atoms, (5)

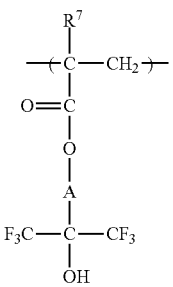

wherein R⁷ represents a hydrogen atom, a methyl group, a trifluoromethyl group, or a hydroxymethyl group and A represents a single bond, a linear or branched alkylene group having 1 to 6 carbon atoms in the main chain, a divalent alicyclic hydrocarbon group having 4 to 20 carbon atoms, a group -A'-O— (wherein A' represents a linear or branched alkylene group having 1 to 6 carbon atoms in the main chain and bonds to the ester oxygen atom in the formula (5)), or a group -A"-COO— (wherein A" represents a linear or branched alkylene group having 1 to 6 carbon atoms in the main chain and bonds to the ester oxygen atom in the formula (5)), (6)

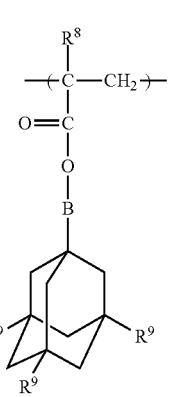

wherein R⁸ represents a hydrogen atom, a methyl group, a trifluoromethyl group, or a hydroxymethyl group, B represents a single bond, a linear or branched alkylene group having 1 to 4 carbon atoms in the main chain, and R⁹ individually represents a hydrogen atom, a hydroxyl group, a cyano group, a carboxyl group, a group —COOR¹⁰ (wherein R¹⁰ represents a linear or branched alkyl group having 1 to 4 carbon atoms or a monovalent alicyclic hydrocarbon group having 3 to 20 carbon atoms), or a group -M-R¹¹ (wherein M represents a linear or branched alkylene group having 1 to 3 carbon atoms in the main chain and R¹¹ represents a hydrogen atom, a hydroxyl group, a cyano group, or a group —COOR¹² (wherein R¹² represents a hydrogen atom, a linear or branched alkyl group having 1 to 4 carbon atoms, or a monovalent alicyclic hydrocarbon group having 3 to 20 carbon atoms)), provided that one or more R⁹s are groups other than a hydrogen atom, (7)

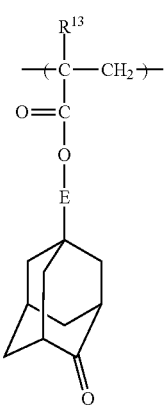

wherein R¹³ represents a hydrogen atom, a methyl group, a trifluoromethyl group, or a hydroxymethyl group and E represents a single bond, a substituted or unsubstituted, linear or branched alkylene group having 1 to 6 carbon atoms in the main chain, a substituted or unsubstituted divalent alicyclic hydrocarbon group having 4 to 20 carbon atoms, a group -E'-O— (wherein E' represents a linear or branched alkylene group having 1 to 6 carbon atoms in the main chain and bonds to the ester oxygen atom in the formula (7)), or a group -E"-COO— (wherein E" represents a linear or branched alkylene group having 1 to 6 carbon atoms in the main chain and bonds to the ester oxygen atom in the formula (7)), and (8)

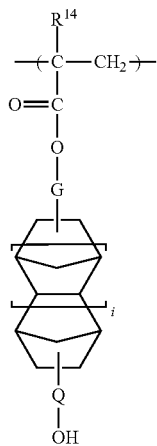

wherein $R^{14}$ represents a hydrogen atom, a methyl group, a trifluoromethyl group, or a hydroxymethyl group, G represents a single bond, a substituted or unsubstituted, linear or branched alkylene group having 1 to 6 carbon atoms in the main chain, a substituted or unsubstituted divalent alicyclic hydrocarbon group having 4 to 20 carbon atoms, a group -G'-O— (wherein G' represents a linear or branched alkylene group having 1 to 6 carbon atoms in the main chain and bonds to the ester oxygen atom in the formula (8)), or a group -G"-COO— (wherein G" represents a linear or branched alkylene group having 1 to 6 carbon atoms in the main chain and bonds to the ester oxygen atom in the formula (8)), Q represents a single bond, a substituted or unsubstituted, linear or branched alkylene group having 1 to 6 carbon atoms in the main chain, a substituted or unsubstituted divalent alicyclic hydrocarbon group having 4 to 20 carbon atoms, a group —Q'—O— (wherein Q' represents a linear or branched alkylene group having 1 to 6 carbon atoms in the main chain and bonds to the ester oxygen atom in the formula (8)), or a group -Q"-COO— (wherein Q" represents a linear or branched alkylene group having 1 to 6 carbon atoms in the main chain and bonds to the ester oxygen atom in the formula (8)), and i is 0 or 1.

10. The radiation-sensitive resin composition according to claim 9, wherein the $R^1$ in the formula (1), the $R^2$ in the formula (2), and the $R^3$ in the formula (3) in the lactone-containing copolymer [I] are a methyl group and the $R^1$ in the formula (1), the $R^2$ in the formula (2), and the $R^3$ in the formula (3) in the lactone-containing copolymer [II] are a methyl group.

11. The radiation-sensitive resin composition according to claim 9, wherein m and m' in the formula (1) are respectively 1 and 2 and n in the formula (3) is 1 in the lactone-containing copolymer [I] and m and m' in the formula (1) are respectively 1 and 2 and n in the formula (3) is 1 in the lactone-containing copolymer [II].

12. The radiation-sensitive resin composition according to claim 9, wherein the $R^1$ in the formula (1), the $R^2$ in the formula (2), and the $R^3$ in the formula (3) are a methyl group, m and m' in the formula (1) are respectively 1 and 2, and n in the formula (3) is 1 in the lactone-containing copolymer [I], and the $R^1$ in the formula (1), the $R^2$ in the formula (2), and the $R^3$ in the formula (3) are a methyl group, m and m' in the formula (1) are respectively 1 and 2, and n in the formula (3) is 1 in the lactone-containing copolymer (II).

13. The radiation sensitive resin composition according to claim 9, wherein the amount of the recurring unit of the formula (1), the recurring unit of the formula (2), and the recurring unit of the formula (3) are respectively 5 to 40 mol %, 20 to 60 mol %, and 10 to 70 mol % of all recurring units in the lactone-containing copolymer [I], and the total amount of the recurring unit (1), the recurring unit (2), and the recurring unit (3) is 20 to 80 mol % and the total amount of the recurring units of the formulas (4) to (8) is 20 to 80 mol % of all recurring units in, the lactone-containing copolymer [II].

14. The radiation-sensitive resin composition according to claim 9, wherein the content of the lactone-containing copolymer (I) is 30 to 90 wt % in the component (a).

15. The radiation-sensitive resin composition according to claim 13, wherein the content of the lactone-containing copolymer (I) is 30 to 90 wt % in the component (a).

16. The radiation-sensitive resin composition according to claim 9, wherein (b) the photoacid generator is an onium salt.

17. The radiation-sensitive resin composition according to claim 13, wherein (b) the photoacid generator is an onium salt.

18. The radiation-sensitive resin composition according to claim 14, wherein (b) the photoacid generator is an onium salt.

19. The radiation-sensitive resin composition according to claim 15, wherein (b) the photoacid generator is an onium salt.

* * * * *